US010739387B2

(12) United States Patent
Ishikawa et al.

(10) Patent No.: US 10,739,387 B2
(45) Date of Patent: Aug. 11, 2020

(54) CURRENT DETECTOR FOR BIDIRECTIONAL SWITCHING POWER SUPPLY

(71) Applicant: FDK CORPORATION, Tokyo (JP)

(72) Inventors: Miyabi Ishikawa, Tokyo (JP); Norio Fukui, Tokyo (JP)

(73) Assignee: FDK CORPORATION, Tokyo (JP)

( * ) Notice: Subject to any disclaimer, the term of this patent is extended or adjusted under 35 U.S.C. 154(b) by 63 days.

(21) Appl. No.: 16/225,884

(22) Filed: Dec. 19, 2018

(65) Prior Publication Data

US 2019/0187188 A1 Jun. 20, 2019

(30) Foreign Application Priority Data

Dec. 20, 2017 (JP) ................. 2017-244202

(51) Int. Cl.
*G01R 19/165* (2006.01)
*H03K 17/082* (2006.01)
*G01R 27/08* (2006.01)
*H02M 3/158* (2006.01)
*H02M 1/00* (2006.01)

(52) U.S. Cl.
CPC ....... *G01R 19/16547* (2013.01); *G01R 27/08* (2013.01); *H02M 3/158* (2013.01); *H03K 17/0822* (2013.01); *H02M 3/1582* (2013.01); *H02M 2001/0009* (2013.01); *H03K 2217/0027* (2013.01)

(58) Field of Classification Search
CPC .......... H02H 9/025; H02H 9/02; H02H 9/026; H02H 9/04; G05F 1/10; H03F 1/52; G01R 19/0092; G01R 19/16542; G01R 19/16571; G01R 31/40; G01R 33/0029; G01R 19/16547; G01R 27/08; G06F 1/26; H03K 17/0822; H03K 2217/0027; H02M 3/1582; H02M 2001/0009; H02M 2001/0012; H02M 3/158
See application file for complete search history.

(56) References Cited

U.S. PATENT DOCUMENTS 6,977,513 B2 * 12/2005 Matsunaga ...... G01R 19/16542
320/134
7,327,130 B1 * 2/2008 Giannopoulos ..... H02M 3/1588
323/275

(Continued)

FOREIGN PATENT DOCUMENTS

CN 106124840 A 11/2016
JP 2002199606 A 7/2002

OTHER PUBLICATIONS

Extended European Search Report dated Apr. 23, 2019, received for corresponding European Application No. 18213679.6.

*Primary Examiner* — Vinh P Nguyen
(74) *Attorney, Agent, or Firm* — Kinney & Lange, P.A.

(57) ABSTRACT

A detection circuit detects a current value obtained from a mathematically processed signal to be inputted in a former half period of bisected halves of an ON period of a switching element when step-down operation is performed. Moreover, the detection circuit detects a current value obtained from a mathematically processed signal to be inputted in a latter half period of bisected halves of an ON period of a switching element when step-up operation is performed.

4 Claims, 6 Drawing Sheets

(56) References Cited

U.S. PATENT DOCUMENTS

| | | | | |
|---|---|---|---|---|
| 8,410,826 | B2* | 4/2013 | Koto | G01R 19/0092 |
| | | | | 327/108 |
| 9,692,329 | B2* | 6/2017 | Guo | H02P 6/20 |
| 2004/0066594 | A1* | 4/2004 | Gonthier | H03K 17/0828 |
| | | | | 361/93.1 |
| 2013/0162171 | A1 | 6/2013 | Ishii et al. | |
| 2014/0347029 | A1 | 11/2014 | Daub | |

\* cited by examiner

CURRENT DETECTOR FOR BIDIRECTIONAL SWITCHING POWER SUPPLY

BACKGROUND

Technical Field

The present disclosure relates to a current detector for a bidirectional switching power supply, wherein the current detector detects a current flowing through a detection resistor provided between a low-side switching element contained in the bidirectional switching power supply, and a reference potential point.

Description of the Related Art

For example, as disclosed in Japanese Patent Application Publication No. 2002-199606, there is a known bidirectional switching power supply which selectively performs step-up operation and step-down operation of input voltage. In the bidirectional switching power supply, a current is detected which flows through a detection resistor provided between a low-side switching element contained therein, and a reference potential point. At this moment, overcurrent which occurs in the bidirectional switching power supply is detected by grasping a peak value of detected current, thereby preventing breakage of elements installed in the bidirectional switching power supply. Here, a conceivable method of detecting current flowing through the detection resistor is to amplify current flowing through a detection resistor by an amplifier circuit such as an operational amplifier, and detect the value of the amplified current by a detection circuit via an analog comparator or an analog-to-digital (A/D) terminal of a microcomputer.

Incidentally, the waveform of the current flowing through the above described detection resistor differs between the step-down and step-up operations. Specifically, the direction of current flowing through the above described detection resistor differs between the step-down and step-up operations. Moreover, the current flowing through the detection resistor decreases in its value as time passes when step-down operation is performed. Further, the current flowing through the detection resistor increases in its value as time passes when step-up operation is performed. For this reason, a bidirectional switching power supply requires a circuit configuration which is able to distinctively detect current for each operation.

For example, in a conceivable circuit configuration, a special-purpose current detection circuit for detecting current flowing through a detection resistor is provided respectively for each operation. One current detection circuit detects current flowing through the detection resistor when step-down operation is performed. Further, the other current detection circuit detects current flowing through the detection resistor when step-up operation is performed. However, when a special-purpose current detection circuit for detecting current flowing through the detection resistor is provided separately for each operation, problems arise in that the circuit configuration becomes complicated and the installation cost increases due to the increase of circuit components.

Besides the above, a circuit configuration is conceivable in which the current detection circuits for detecting current flowing through the detection resistor are unified. In such a current detection circuit, current flowing through the detection resistor is detected when step-down operation is performed and when step-up operation is performed, and according to the waveform of the detected current, it is grasped that which of the currents of step-down operation and step-up operation is detected. However, a phenomenon may occur in which a waveform characteristic of a current which is not actually flowing and is supposed to be detected when step-up operation is performed is detected even though step-down operation is being performed. Also, a phenomenon may occur in which a waveform characteristic of a current which is not actually flowing and is supposed to be detected when step-down operation is performed is detected even though step-up operation is being performed.

For example, there is a case in which the output current (load current) becomes not more than a critical point (for example, 0 A), and current flowing through the detection resistor flows in both positive and negative directions with 0 A as a border. In this case, it cannot be determined to which operation the detected current corresponds. As a result, the detection accuracy of current in the current detection circuit will deteriorate.

SUMMARY

A current detector for a bidirectional switching power supply according to an aspect of the present disclosure is configured to detect current flowing through a detection resistor provided between a low-side switching element, which is contained in the bidirectional switching power supply for selectively performing step-down operation and step-up operation, and a reference potential point, and comprises: an inverting amplifier circuit for inversely amplifying a current signal relating to temporal change of current flowing through the detection resistor, and outputting the same as an inversely amplified signal; a non-inverting amplifier circuit for non-inversely amplifying a current signal relating to temporal change of current flowing through the detection resistor, and outputting the same as a non-inversely amplified signal; an OR circuit for mathematically processing each input of the inversely amplified signal and the non-inversely amplified signal by logical sum and outputting a mathematically processed signal; and a detection circuit for detecting a value of current flowing through the detection resistor from the mathematically processed signal, wherein the detection circuit detects the current value obtained from the mathematically processed signal to be inputted in a former half period of bisected halves of the ON period of the switching element when step-down operation is performed, and detects the current value obtained from the mathematically processed signal to be inputted in a latter half period of bisected halves of the ON period of the switching element when step-up operation is performed.

According to the above described configuration, in the current detector for a bidirectional switching power supply according to an aspect of the present disclosure, the detection circuit detects a current value, which is obtained from the mathematically processed signal to be inputted in a former half period of bisected halves of the ON period of the low-side switching element, as a current value of step-down operation when step-down operation is performed. As a result of this, the current detector for a bidirectional switching power supply according to the present embodiment can accurately detect the value of current flowing through the detection resistor when step-down operation is performed. Moreover, the detection circuit detects a current value, which is obtained from the mathematically processed signal to be inputted in a latter half period of bisected halves of the ON period of the low-side switching element, as a current value of step-up operation when step-up operation is performed. As a result of this, the current detector for a bidirectional switching power supply according to an aspect of the present disclosure can accurately detect the value of current flowing through a detection resistor when a step-up operation is performed. That is, the current detector of the bidirectional switching power supply according to the present embodiment can accurately detect the value of current flowing through a detection resistor even without providing a special purpose current detector for each operation.

The current detector for a bidirectional switching power supply according to an aspect of the present disclosure allows improvement in detection accuracy of current while reducing the installation cost of a circuit.

BRIEF DESCRIPTION OF THE DRAWINGS

The present invention will become more fully understood from the detailed description given hereinafter and the accompanying drawings which are given by way of illustration only, and thus, are not limitative of the present invention, and wherein.

DETAILED DESCRIPTION

Hereinafter, a current detector for a bidirectional switching power supply according to an embodiment of the present disclosure will be described with reference to the drawings. Note that the present embodiment will not be limited to contents to be described below, but can be practiced by arbitrarily modifying it within a range not departing from the spirit thereof. Moreover, any of the drawings to be used for description of the embodiments schematically shows components, which are partially emphasized, enlarged, reduced, or omitted for the sake of better understanding, and there are cases where the size and shape of components are not accurately represented.

Figure 1:
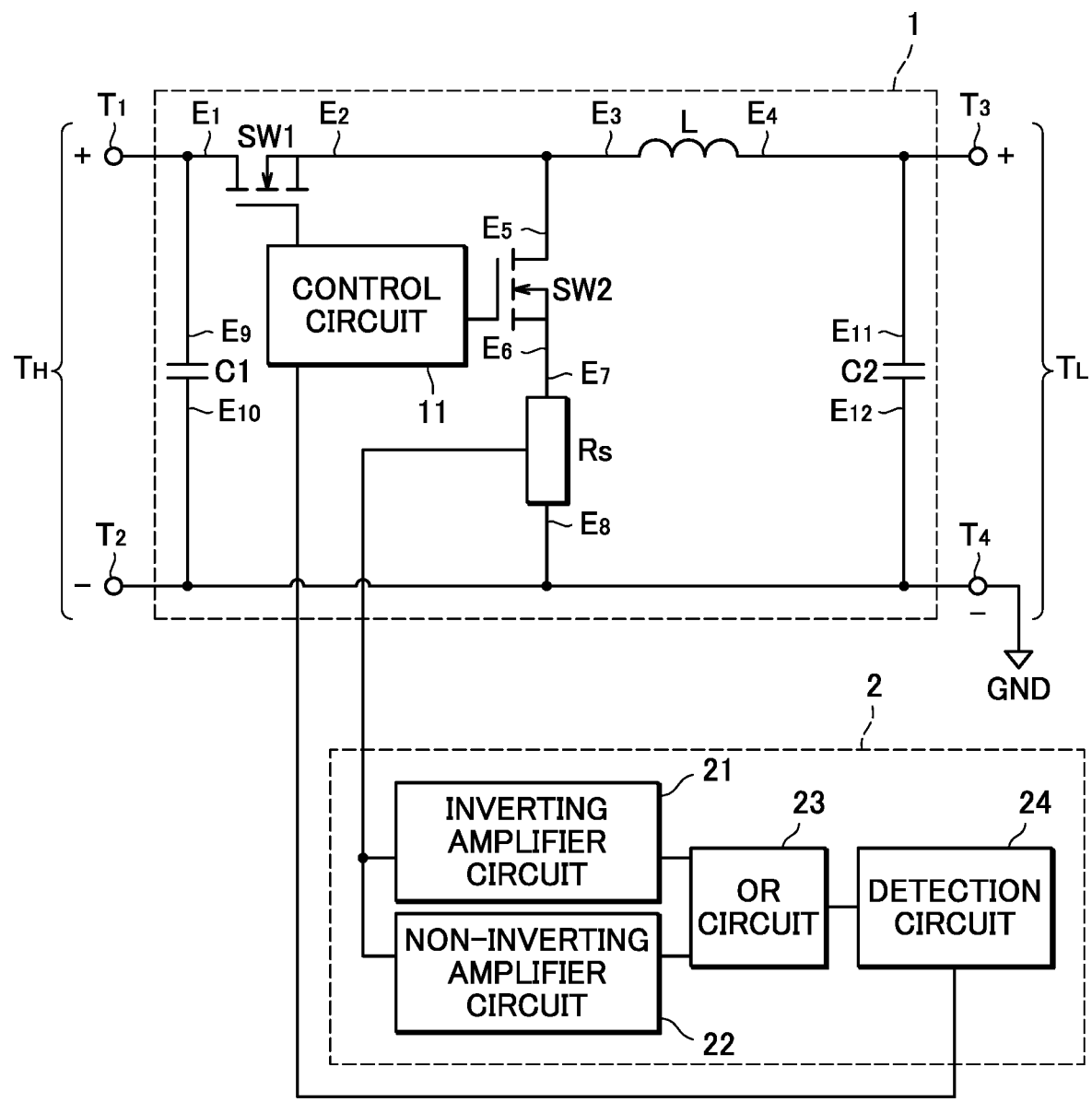
FIG. 1 is a block diagram to show a current detector according to the present embodiment and to be used for a bidirectional switching power supply, and the bidirectional switching power supply in which the current detector is installed.

FIG. 1 is a block diagram to show a current detector 2 according to the present embodiment and to be used for a bidirectional switching power supply 1, and the bidirectional switching power supply 1 in which the current detector 2 is installed. First, the configuration of the bidirectional switching power supply 1 shown in FIG. 1 will be described.

The bidirectional switching power supply 1 shown in FIG. 1, for example, converts voltage inputted from either one of a first input/output end $T_H$ and a second input/output end $T_L$, and outputs the same from the other thereof. As a result of this, the bidirectional switching power supply 1 selectively performs step-down operation and step-up operation on the inputted voltage. The first input/output end $T_H$ of the present embodiment has a first positive electrode end $T_1$ and a first negative electrode end $T_2$, and is installed on the high voltage side. The second input/output end $T_L$ of the present embodiment has a second positive electrode end $T_3$ and a second negative electrode end $T_4$, and is installed on the low voltage side. Moreover, the second negative electrode end $T_4$ is grounded to a reference potential point GND.

Moreover, the bidirectional switching power supply 1 shown in FIG. 1 includes a high-side switching element SW1, a coil L, a low-side switching element SW2, a detection resistor Rs, a first capacitor C1, a second capacitor C2, and a control circuit 11.

A first end $E_1$ which is one end on the high voltage side of the switching element SW1 is connected to the first positive electrode end $T_1$. A second end $E_2$ which is the other end on the low voltage side of the switching element SW1 is connected to a first end $E_3$ which is one end of the high voltage side of the coil L. A second end $E_4$ which is the other end on the low voltage side of the coil L is connected to the second positive electrode end $T_3$. A first end $E_5$ which is one end of the switching element SW2 is connected to between the second end $E_2$ of the switching element SW1 and the first end $E_3$ of the coil L. The detection resistor Rs is connected in series to the switching element SW2. That is, a first end $E_7$ which is one end of the detection resistor Rs is connected to a second end $E_6$ which is the other end of the switching element SW2. Moreover, a second end $E_8$ which is the other end of the detection resistor Rs is connected to the second negative electrode end $T_4$. That is, the second end $E_8$ of the detection resistor Rs is grounded to the reference potential point GND. Hereinafter, in embodiments, for the sake of convenience of explanation, it is described as being grounded to the reference potential point GND when being connected to the second negative electrode end $T_4$.

A first end $E_9$ which is one end of the first capacitor C1 is connected to between the first positive electrode end $T_1$ and the first end $E_1$ of the switching element SW1. Moreover, a second end $E_{10}$ which is the other end of the first capacitor C1 is grounded to the reference potential point GND. A first end $E_{11}$ which is one end of the second capacitor C2 is connected to between the second positive electrode end $T_3$ and the second end $E_4$ of the coil L. Moreover, a second end $E_{12}$ which is the other end of the second capacitor C2 is grounded to the reference potential point GND.

The control circuit 11 outputs a control signal for selectively and successively driving the above described switching elements SW1 and SW2 according to step-down operation or step-up operation. For example, the control circuit 11 outputs a first control signal for turning on the switching element SW1, and a second control signal for turning on the switching element SW2. The first control signal and the second control signal, which are outputted from the control circuit 11, are each a pulse signal in which an ON period and an OFF period are repeated at a constant cycle. The control circuit 11 is, for example, a microcomputer. The control circuit 11 is connected to a constant voltage source Vcc not shown.

Next, the configuration of the current detector 2 shown in FIG. 1 will be described. The current detector 2 detects current that flows through the detection resistor Rs provided between the low-side switching element SW2 and the reference potential point GND.

The current detector 2 shown in FIG. 1 includes an inverting amplifier circuit 21, a non-inverting amplifier circuit 22, an OR circuit 23, and a detection circuit 24. The inverting amplifier circuit 21 inversely amplifies a current signal relating to temporal change of current flowing through the detection resistor Rs, and outputs the same as an inversely amplified signal. The non-inverting amplifier circuit 22 non-inversely amplifies a current signal relating to temporal change of current flowing through the detection resistor Rs, and outputs the same as a non-inversely amplified signal.

The OR circuit 23 mathematically processes each input of an inversely amplified signal outputted from the inverting amplifier circuit 21 and a non-inversely amplified signal outputted from the non-inverting amplifier circuit 22 by logical sum, and outputs a mathematically processed signal. In the OR circuit 23, a diode (not shown) is provided in a path through which each of an inversely amplified signal and a non-inversely amplified signal is inputted. That is, the OR circuit 23 outputs forward (positive direction) signal components of the inputted inversely amplified signal and non-inversely amplified signal as mathematically processed signals.

The detection circuit 24 detects the value of current flowing through the detection resistor Rs, from the mathematically processed signal outputted from the OR circuit 23. Moreover, the detection circuit 24 detects which of step-down operation and step-up operation is being performed in the bidirectional switching power supply 1. For example, the detection circuit 24 is connected to the above described control circuit 11, and detects which of step-down operation and step-up operation is being performed based on ON and OFF states of the switching element SW1 and the switching element SW2 caused by the control circuit 11.

Here, the flow of current which flows through the detection resistor Rs when step-down operation and step-up operation are performed respectively in the bidirectional switching power supply 1 in the present embodiment, as well as the current detection method in the current detector 2 will be described in detail.

In this section (step-down operation), a case in which step-down operation is performed in the bidirectional switching power supply 1 will be described. That is, the bidirectional switching power supply 1 receives voltage input from the first input/output end $T_H$ and steps down the inputted voltage, thus outputting the same to the second input/output end $T_L$.

First, when performing step-down operation, the control circuit 11 turns on the switching element SW1 and turns off the switching element SW2. As a result of this, current flows from the first positive electrode end $T_1$ to the reference potential point GND via the switching element SW1, the coil L, and the second capacitor C2. At this moment, in the coil L, an electromotive force occurs which causes a current flow from the first end $E_3$ of the coil L toward the second end $E_4$ of the coil L.

Next, the control circuit 11 turns off the switching element SW1 and turns on the switching element SW2. As a result of this, a current flows from the reference potential point GND to the second input/output end $T_L$ via the detection resistor Rs, the switching element SW2, and the coil L. That is, current flows from the reference potential point GND toward the switching element SW2. The reason for this is that an electromotive force, which causes a current flow from the first end $E_3$ of the coil L toward the second end $E_4$ of the coil L, has occurred in the coil L. After the above described process, the bidirectional switching power supply 1 receives voltage input from the first input/output end $T_H$, and steps down the inputted voltage, thereafter outputting the same to the second input/output end $T_L$.

Figure 2A:
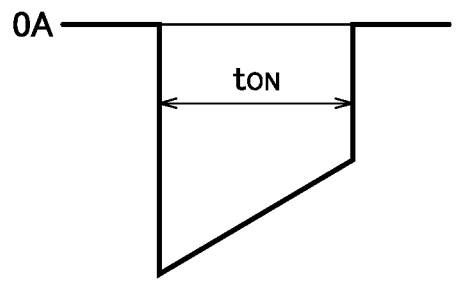
FIG. 2A is a waveform diagram to show current signal relating to temporal change of current flowing through a detection resistor when step-down operation is performed.
Figure 2B:
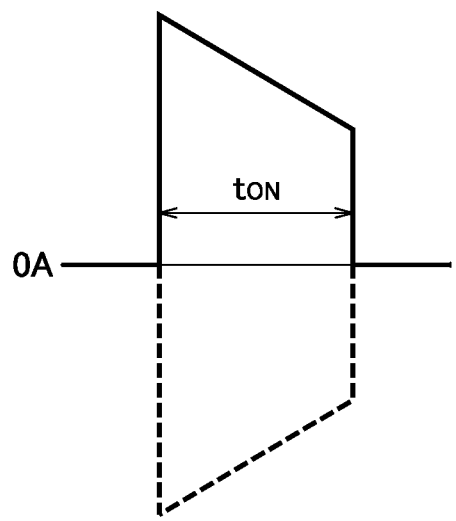
FIG. 2B is a waveform diagram to show current signal relating to temporal change of current flowing through a detection resistor when step-down operation is performed.
Figure 2C:
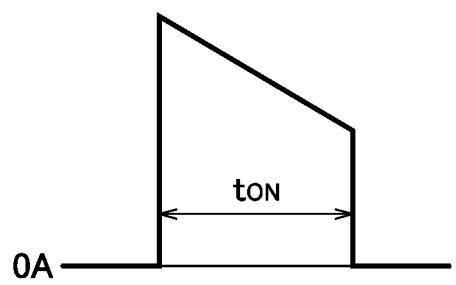
FIG. 2C is a waveform diagram to show current signal relating to temporal change of current flowing through a detection resistor when step-down operation is performed.

FIG. 2A to 2C are waveform diagrams to show a current signal relating to temporal change of current flowing through the detection resistor Rs when step-down operation is performed. The current signal shown in FIG. 2A is a pulse signal having a time width corresponding to an ON period $t_{on}$ of the switching element SW2. Here, the inverting amplifier circuit 21 inversely amplifies the current signal shown in FIG. 2A and outputs the same as an inversely amplified signal (a solid line shown in FIG. 2B). Moreover, the non-inverting amplifier circuit 22 non-inversely amplifies the current signal shown in FIG. 2A and outputs the same as a non-inversely amplified signal (a dotted line shown in FIG. 2B).

Further, the inversely amplified signal and the non-inversely amplified signal, which are shown in FIG. 2B, are inputted into the OR circuit. Since a diode (not shown) is provided in the path through which each of the inversely amplified signal and the non-inversely amplified signal are inputted, the OR circuit allows a signal larger than 0 A to pass, and does not allow a signal less than 0 A to pass. That is, the OR circuit 23 will not allow a non-inversely amplified signal, which is less than 0 A, to pass, and outputs an inversely amplified signal, which is larger than 0 A, as a mathematically processed signal shown in FIG. 2C. The mathematically processed signal shown in FIG. 2C shows that the current value decreases as time passes in the ON period $t_{on}$ of the switching element SW2. That is, the mathematically processed signal has a waveform characteristic of a current which is detected when step-down operation is performed. The detection circuit 24 detects a current value obtained from the mathematically processed signal shown in FIG. 2C as a current value of step-down operation.

Figure 3A:
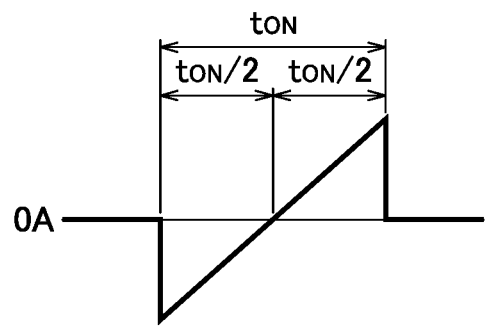
FIG. 3A is a waveform diagram to show a current signal relating to temporal change of current flowing through the detection resistor when output current (load current) becomes not more than a critical point and when step-down operation is performed.
Figure 3B:
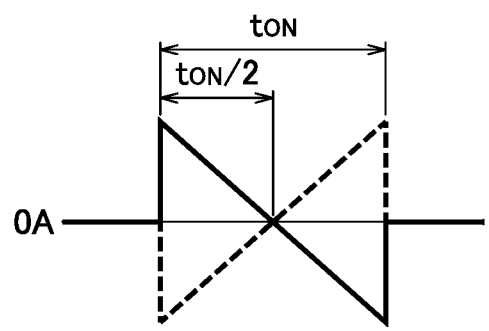
FIG. 3B is a waveform diagram to show a current signal relating to temporal change of current flowing through the detection resistor when output current (load current) becomes not more than a critical point and when step-down operation is performed.
Figure 3C:
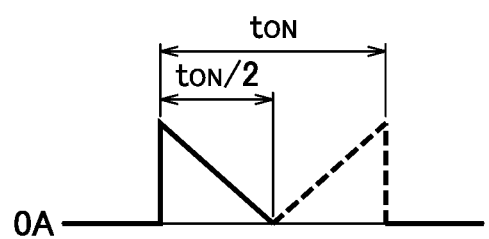
FIG. 3C is a waveform diagram to show a current signal relating to temporal change of current flowing through the detection resistor when output current (load current) becomes not more than a critical point and when step-down operation is performed.

On the other hand, there is a case in which output current (load current) to be outputted from the second input/output end $T_L$ becomes not more than a critical point (for example, 0 A), and the current flowing through the detection resistor Rs flows in both positive and negative directions with 0 A as a border. FIG. 3A to 3C are waveform diagrams to show a current signal relating to temporal change of current flowing through the detection resistor when step-down operation is performed, and when the output current (load current) becomes not more than a critical point, and the current flowing through the detection resistor Rs flows in both positive and negative directions with 0 A as a border. Here, the inverting amplifier circuit 21 inversely amplifies the current signal shown in FIG. 3A, and outputs the same as an inversely amplified signal (a solid line in FIG. 3B). Moreover, the non-inverting amplifier circuit 22 non-inversely amplifies the current signal shown in FIG. 3A and outputs the same as a non-inversely amplified signal (a dotted line shown in FIG. 3B). Further, the inversely amplified signal and the non-inversely amplified signal, which are shown in FIG. 3B, are inputted into the OR circuit 23. Since a diode (not shown) is provided in the path through which each of the inversely amplified signal and the non-inversely amplified signal is inputted, the OR circuit 23 does not allow the non-inversely amplified signal in a former half period and the inversely amplified signal of a latter half period, which are less than 0 A, to pass, and causes the inversely amplified signal in the former half period and the non-inversely amplified signal of the latter half period, which are more than 0 A, to be superposed on each other, thus outputting the same as a mathematically processed signal as shown in FIG. 3C.

The mathematically processed signal shown in FIG. 3C shows that the current value decreases as time passes in the former half period (the period of 0 to $t_{on}/2$) of bisected halves of the ON period $t_{on}$ of the switching element SW2. Moreover, the mathematically processed signal shown in FIG. 3C shows that the current value increases as time passes in the latter half period (the period of $t_{on}/2$ to $t_{on}$) of bisected halves of the ON period $t_{on}$ of the switching element SW2. That is, a phenomenon occurs in which even though step-down operation is performed in the bidirectional switching power supply 1, a waveform characteristic of a current, which is to be detected when step-up operation is performed and which is actually not flowing, is detected. As a result, a mathematically processed signal, in which a current signal relating to temporal change of a current which is actually flowing and is to be detected when step-down operation is performed, and a current signal relating to temporal change of a current which is actually not flowing and is to be detected when step-up operation is performed are superposed on each other, will be outputted unintentionally from the OR circuit 23.

For this reason, the detection circuit 24 in the present embodiment detects a current value obtained only from the mathematically processed signal which is inputted in the former half period (a period from 0 to $t_{on}/2$) of bisected halves of the ON period $t_{on}$ of the switching element SW2, as a current value of step-down operation. The detection circuit 24 will not detect a current signal relating to temporal change of a current which is not actually flowing and is to be detected when step-up operation is performed. That is, the detection circuit 24 detects only the inversely amplified signal, and performs blanking of non-inversely amplified signal. This enables the current detector 2 according to the present embodiment to accurately detect the value of current flowing through the detection resistor Rs when step-down operation is performed.

In this section (step-up operation), a case in which step-up operation is performed in the bidirectional switching power supply 1 will be described. That is, the bidirectional switching power supply 1 receives voltage input from the second input/output end $T_L$ and steps up the inputted voltage to output the same to the first input/output end $T_H$.

First, the control circuit 11 turns on the switching element SW2 and turns off the switching element SW1 when step-up operation is performed. As a result of this, the current flows from the second positive electrode end $T_3$ to the reference potential point GND via the coil L, the switching element SW2, and the detection resistor Rs. At this moment, an electromotive force occurs which causes a current flow from the second end $E_4$ of the coil L toward the first end $E_3$ of the coil L. Moreover, since a closed loop circuit consisting of the coil L and the second capacitor C2 is formed, the electromotive force further increases.

Next, the control circuit 11 turns off the switching element SW2 and turns on the switching element SW1. As a result of this, a current flows to the first input/output end $T_H$ via the coil L and the switching element SW2. The reason for this is that an electromotive force, which causes a current flow from the second end $E_4$ of the coil L toward the first end $E_3$ of the coil L, has occurred in the coil L. After the above described process, the bidirectional switching power supply 1 receives voltage input from the second input/output end $T_L$, and steps up the inputted voltage, thereafter outputting the same to the first input/output end $T_H$.

Figure 4A:
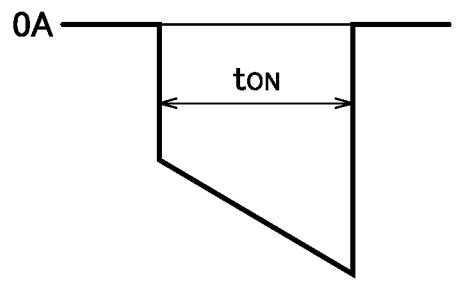
FIG. 4A is a waveform diagram to show a current signal relating to temporal change of current flowing through the detection resistor when step-up operation is performed.
Figure 4B:
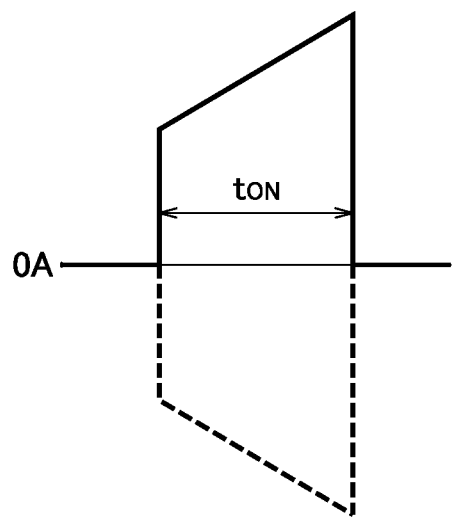
FIG. 4B is a waveform diagram to show a current signal relating to temporal change of current flowing through the detection resistor when step-up operation is performed.
Figure 4C:
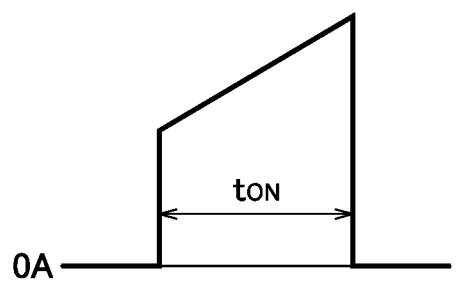
FIG. 4C is a waveform diagram to show a current signal relating to temporal change of current flowing through the detection resistor when step-up operation is performed.

FIG. 4A to 4C are waveform diagrams to show a current signal relating to temporal change of current flowing through the detection resistor when step-up operation is performed. The current signal shown in FIG. 4A is a pulse signal having a time width corresponding to the ON period $t_{on}$ of the switching element SW2. Here, the inverting amplifier circuit 21 inversely amplifies the current signal shown in FIG. 4A, and outputs the same as an inversely amplified signal (a solid line shown in FIG. 4B). Moreover, the non-inverting amplifier circuit 22 non-inversely amplifies the current shown in FIG. 4A and outputs the same as a non-inversely amplified signal (a dotted line shown in FIG. 4B).

Further, the inversely amplified signal and the non-inversely amplified signal, which are shown in FIG. 4B, are inputted into the OR circuit 23. Since a diode (not shown) is provided in the path through which each of the inversely amplified signal and the non-inversely amplified signal is inputted, the OR circuit 23 does not allow the inversely amplified signal, which is less than 0 A, to pass, and outputs the non-inversely amplified signal, which is more than 0 A, as a mathematically processed signal as shown in FIG. 4C. The mathematically processed signal shown in FIG. 4C shows that the current value increases as time passes in the ON period $t_{on}$ of the switching element SW2. That is, the mathematically processed signal has a waveform characteristic of the current which is to be detected when step-up operation is performed. The detection circuit 24 detects a current value obtained from the mathematically processed signal shown in FIG. 4C as the current value of step-up operation.

Figure 5A:
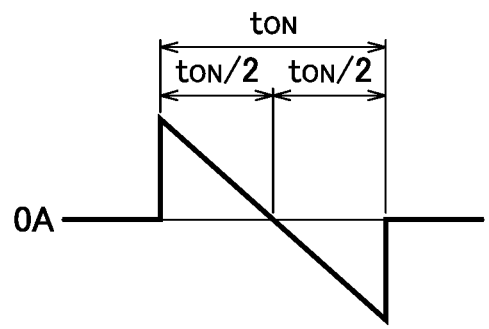
FIG. 5A is a waveform diagram to show a current signal relating to temporal change of current flowing through a detection resistor when output current (load current) becomes not more than a critical point and when step-up operation is performed.
Figure 5B:
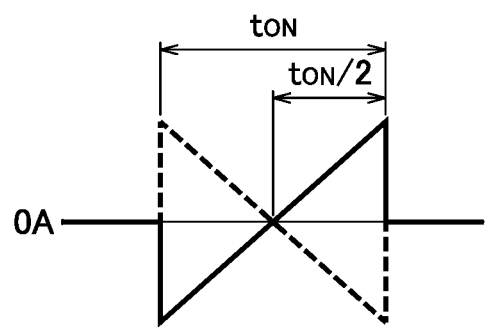
FIG. 5B is a waveform diagram to show a current signal relating to temporal change of current flowing through a detection resistor when output current (load current) becomes not more than a critical point and when step-up operation is performed.
Figure 5C:
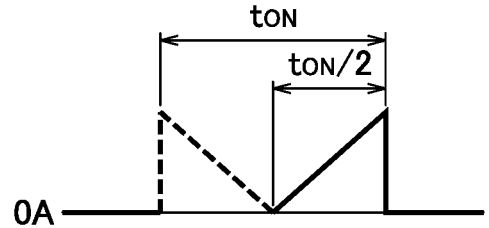
FIG. 5C is a waveform diagram to show a current signal relating to temporal change of current flowing through a detection resistor when output current (load current) becomes not more than a critical point and when step-up operation is performed.

On the other hand, there is a case in which output current (load current) to be outputted from the second input/output end $T_L$ becomes not more than a critical point (for example, 0 A), and the current flowing through the detection resistor Rs flows in both positive and negative directions with 0 A as a border. FIG. 5A to 5C are waveform diagrams to show a current signal relating to temporal change of current flowing through a detection resistor when step-up operation is performed, and when output current (load current) becomes not more than a critical point and the current that flows through the detection resistor Rs flows in both positive and negative directions. Here, the inverting amplifier circuit 21 inversely amplifies the current signal shown in FIG. 5A and outputs the same as an inversely amplified signal (a solid line shown in FIG. 5B). Further, the inversely amplified signal and the non-inversely amplified signal, which are shown in FIG. 3B, are inputted into the OR circuit 23. Since a diode (not shown) is provided in the path through which each of the inversely amplified signal and the non-inversely amplified signal is inputted, the OR circuit 23 does not allow the inversely amplified signal in the former half period and the non-inversely amplified signal of the latter half period, which are less than 0 A, to pass, and causes the non-inversely amplified signal in the former half period and the inversely amplified signal of the latter half period, which are more than 0 A, to be superposed on each other, thus outputting the same as the mathematically processed signal as shown in FIG. 5C.

The mathematically processed signal shown in FIG. 5C shows that the current value decreases as time passes in the former half period (the period of 0 to $t_{on}/2$) of bisected halves of the ON period $t_{on}$ of the switching element SW2. Moreover, the mathematically processed signal shown in FIG. 5C shows that the current value increases as time passes in the latter half period (the period of $t_{on}/2$ to $t_{on}$) of bisected halves of the ON period $t_{on}$ of the switching element SW2. That is, a phenomenon occurs in which even though step-down operation is performed in the bidirectional switching power supply 1, a waveform characteristic of a current, which is to be detected when step-up operation is performed and which is actually not flowing, is detected. As a result, a mathematically processed signal, in which a current signal relating to temporal change of a current which is actually flowing and is to be detected when step-up operation is performed, and a current signal relating to temporal change of a current which is actually not flowing and is to be detected when step-down operation is performed are superposed on each other, will be outputted unintentionally from the OR circuit 23.

For this reason, the detection circuit 24 in the present embodiment detects a current value obtained only from the mathematically processed signal which is inputted in the latter half period (a period from 0 to $t_{on}/2$) of bisected halves of the ON period $t_{on}$ of the switching element SW2, as a current value of step-up operation. That is, the detection circuit 24 will not detect a current signal relating to temporal change of a current which is not actually flowing, and is to be detected when step-down operation is performed. That is, the detection circuit 24 detects only the inversely amplified signal, and performs blanking of non-inversely amplified signal. This enables the current detector 2 according to the present embodiment to accurately detect the value of a current flowing through the detection resistor Rs when step-up operation is performed.

Note that in the above described embodiment, the detection circuit 24 may detect a current value corresponding to the former half period or the latter half period only when a mathematically processed signal, in which a current signal relating to temporal change of a current actually flowing through the detection resistor and a current signal relating to temporal change of a current which is actually not flowing through the detection resistor are superposed on each other, is outputted from the OR circuit 23. In other words, if a mathematically processed signal, in which a current signal relating to temporal change of a current actually flowing through the detection resistor and a current signal relating to temporal change of a current which is actually not flowing through the detection resistor are superposed on each other, is not outputted from the OR circuit 23, the detection circuit 24 detects a current value obtained from the mathematically processed signal outputted from the OR circuit 23 as a current value of step-down operation or a current value of step-up operation.

SUMMARY

As described so far, the current detector 2 for a bidirectional switching power supply according to the present embodiment, is configured to detect current flowing through a detection resistor provided between a low-side switching element SW2, which are contained in the bidirectional switching power supply for selectively performing step-down operation and step-up operation, and a reference potential point GND, and comprises: an inverting amplifier circuit 21 for inversely amplifying a current signal relating to temporal change of current flowing through the detection resistor Rs, and outputting the same as an inversely amplified signal; a non-inverting amplifier circuit 22 for non-inversely amplifying a current signal relating to temporal change of current flowing through the detection resistor Rs and outputting the same as a non-inversely amplified signal; an OR circuit 23 for mathematically processing each input of the inversely amplified signal and the non-inversely amplified signal by logical sum and outputting a mathematically processed signal; and a detection circuit 24 for detecting a value of current flowing through the detection resistor from the mathematically processed signal. The detection circuit 24 detects a current value obtained from the mathematically processed signal which is inputted in the former half period of bisected halves of the ON period of the switching element SW2 when step-down operation is performed. Moreover, the detection circuit 24 detects a current value obtained from the mathematically processed signal which is inputted in the latter half period of bisected halves of the ON period of the switching element SW2 when step-up operation is performed.

According to the above-described configuration, in the current detector 2 for a bidirectional switching power supply according to the present embodiment, the detection circuit 24 detects a current value obtained from a mathematically processed signal, which is inputted in the former half period of bisected halves of the ON period of the low-side switching element SW2 when step-down operation is performed, as a current value of step-down operation. This enables the current detector 2 for a bidirectional switching power supply according to the present embodiment to accurately detect the value of current flowing through the detection resistor Rs when step-down operation is performed. Moreover, the detection circuit 24 detects a current value obtained from a mathematically processed signal, which is inputted in the latter half period of bisected halves of the ON period of the low-side switching element SW2 when step-up operation is performed, as a current value of step-up operation. This enables the current detector 2 for a bidirectional switching power supply according to the present embodiment to accurately detect the value of current flowing through the detection resistor Rs when step-up operation is performed. That is, the current detector 2 of the bidirectional switching power supply according to the present embodiment can accurately detect the value of current flowing through a detection resistor even without providing a special purpose current detector for each operation.

In this way, the current detector for a bidirectional switching power supply according to the present embodiment can improve the detection accuracy of current while reducing the installation cost of circuit.

Here, the current detector 2 for a bidirectional switching power supply according to the present embodiment detects a current value obtained from the mathematically processed signal outputted from the OR circuit 23 as a current value of step-down operation or a current value of step-up operation. In the bidirectional switching power supply 1 in the present embodiment, overcurrent which occurs in the bidirectional switching power supply is detected by grasping a peak value of the detected current, thereby preventing breakage of elements installed in the bidirectional switching power supply. That is, it is satisfactory that the detection circuit 24 can detect a peak value of current flowing through the detection resistor Rs. Note that there is an influence of a current, which is not actually flowing, around the center of the ON period $t_{on}$ of the switching element SW2, and the current value may not be accurate.

Figure 6A:
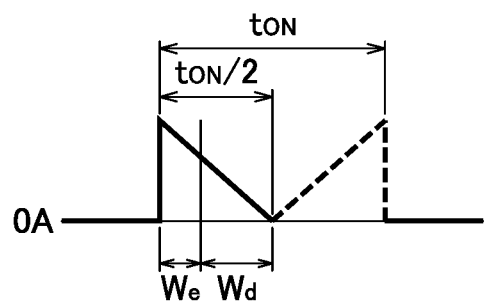
FIG. 6A is a waveform to show a valid range and an invalid range of a mathematically processed signal.
Figure 6B:
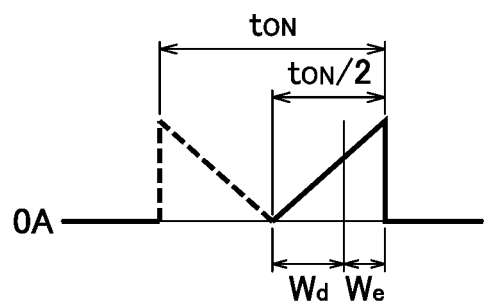
FIG. 6B is a waveform to show a valid range and an invalid range of a mathematically processed signal.

FIGS. 6A and 6B are waveform diagrams to show a valid range $W_d$ and an invalid range $W_e$ of mathematically processed signal. As shown in FIG. 6A, when step-down operation is performed, the detection circuit 24 invalidates a current value obtained from the mathematically processed signal in a predetermined period (invalid range $W_d$ shown in FIG. 6A) having a predetermined width from the center of the ON period $t_{on}$ of the switching element SW2, and validates a current value obtained from the remaining mathematically processed signal (valid range $W_e$ shown in FIG. 6A), among detected current values. Moreover, as shown in FIG. 6B, when step-up operation is performed, the detection circuit 24 invalidates a current value obtained from the mathematically processed signal in a predetermined period (invalid range $W_d$ shown in FIG. 6B) having a predetermined width from the center of the ON period $t_{on}$ of the switching element SW2, and validates a current value obtained from the remaining mathematically processed signals (valid range $W_e$ shown in FIG. 6B), among detected current values. This enables the current detector 2 for a bidirectional switching power supply according to the present embodiment to reduce resources needed for the detection of current value, and further improve the detection accuracy of current.

Note that the current detector 2 for a bidirectional switching power supply according to the above described embodiment detects a current which flows through the detection resistor Rs of a non-insulation type bidirectional switching power supply as shown in FIG. 1. However, the present embodiment will not be limited to this. For example, the current detector 2 for a bidirectional switching power supply according to the present embodiment may detect current flowing through the detection resistor Rs of an insulation type bidirectional switching power supply in which a transformer is provided in the current detector.

ASPECTS OF PRESENT DISCLOSURE

In the current detector for a bidirectional switching power supply, which detects a current flowing through a detection resistor provided between a low-side switching element contained in the bidirectional switching power supply for selectively performing step-down operation and step-up operation, and a reference potential point, a current detector for a bidirectional switching power supply according to a first embodiment of the present embodiment comprises: an inverting amplifier circuit for inversely amplifying a current signal relating to temporal change of current flowing through the detection resistor, and outputting the same as an inversely amplified signal; a non-inverting amplifier circuit for non-inversely amplifying a current signal relating to temporal change of current flowing through the detection resistor, and outputting the same as a non-inversely amplified signal; an OR circuit for mathematically processing each input of the inversely amplified signal and the non-inversely amplified signal by logical sum and outputting a mathematically processed signal; and a detection circuit for detecting a value of current flowing through the detection resistor from the mathematically processed signal.

The detection circuit of the current detector for a bidirectional switching power supply according to the first aspect of the present disclosure detects a current value obtained from a mathematically processed signal to be inputted in a former half period of bisected halves of an ON period of a switching element when step-down operation is performed, and detects a current value obtained from a mathematically processed signal to be inputted in a latter half period of bisected halves of an ON period of a switching element when step-up operation is performed.

In the current detector for a bidirectional switching power supply according to the above described first aspect of the present disclosure, a detection circuit of a current detector for a bidirectional switching power supply according to a second aspect of the present disclosure detects a current value associated with the former half period or the latter half period only when a mathematically processed signal, in which a current value relating to temporal change of a current flowing through the detection resistor when step-down operation is performed, and a current value relating to temporal change of a current flowing through the detection resistor when step-up operation is performed are superposed on each other, is outputted from the OR circuit.

In the current detector for a bidirectional switching power supply according to the above described first aspect of the present disclosure, a detection circuit of a current detector for a bidirectional switching power supply according to a third aspect of the present disclosure detects which of step-down operation and step-up operation is being performed in the bidirectional switching power supply and, according to the detection result of operation in the bidirectional switching power supply, decides whether to detect a current value obtained from the mathematically processed signal to be inputted in the former half period, or whether to detect a current value obtained from the mathematically processed signal to be inputted in the latter half period.

In the current detector for a bidirectional switching power supply according to the above described first aspect of the present disclosure, a detection circuit of a current detector for a bidirectional switching power supply according to a fourth aspect of the present disclosure invalidates a current value obtained from the mathematically processed signal in a predetermined period having a predetermined width from a center of the ON period, and validates a current value obtained from remaining mathematically processed signals, among detected current values.

Embodiments of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A current detector for a bidirectional switching power supply, wherein the current detector is configured to detect a current flowing through a detection resistor provided between a low-side switching element contained in the bidirectional switching power supply which selectively performs step-down operation and step-up operation, and a reference potential point, the current detector for a bidirectional switching power supply comprising:
  an inverting amplifier circuit for inversely amplifying a current signal relating to temporal change of current flowing through the detection resistor, and outputting the same as an inversely amplified signal;
  a non-inverting amplifier circuit for non-inversely amplifying a current signal relating to temporal change of current flowing through the detection resistor, and outputting the same as a non-inversely amplified signal;
  an OR circuit for mathematically processing each input of the inversely amplified signal and the non-inversely amplified signal by logical sum and outputting a mathematically processed signal; and
  a detection circuit for detecting a value of current flowing through the detection resistor from the mathematically processed signal, wherein
  the detection circuit detects the current value obtained from the mathematically processed signal to be inputted in a former half period of bisected halves of an ON period of the switching element when step-down operation is performed, and detects the current value obtained from the mathematically processed signal to be inputted in a latter half period of bisected halves of the ON period of the switching element when step-up operation is performed.

2. The current detector for a bidirectional switching power supply according to claim 1, wherein:
  the detection circuit detects a current value associated with the former half period or the latter half period only when a mathematically processed signal, in which a current value relating to temporal change of a current flowing through the detection resistor when step-down operation is performed, and a current value relating to temporal change of a current flowing through the detection resistor when step-up operation is performed are superposed on each other, is outputted from the OR circuit.

3. The current detector for a bidirectional switching power supply according to claim 1, wherein:
  the detection circuit detects which of step-down operation and step-up operation is being performed in the bidirectional switching power supply and, according to a detection result of operation in the bidirectional switching power supply, decides whether to detect the current value obtained from the mathematically processed signal to be inputted in the former half period, or whether to detect the current value obtained from the mathematically processed signal to be inputted in the latter half period.

4. The current detector for a bidirectional switching power supply according to claim 1, wherein:
  the detection circuit invalidates a current value obtained from the mathematically processed signal in a predetermined period having a predetermined width from a center of the ON period, and validates a current value obtained from remaining mathematically processed signals, among detected current values.

* * * * *